(12) United States Patent
Roussel et al.

(10) Patent No.: US 8,339,146 B2
(45) Date of Patent: Dec. 25, 2012

(54) METHOD FOR CALIBRATING A TRANSMISSION LINE PULSE TEST SYSTEM

(75) Inventors: Philippe Roussel, Linden-Lubbeek (BE); Dimitri Linten, Boortmeerbeek (BE)

(73) Assignees: IMEC, Leuven (BE); Hanwa Electronic Ind. Co., Ltd., Wakayama (JP)

( * ) Notice: Subject to any disclaimer, the term of this patent is extended or adjusted under 35 U.S.C. 154(b) by 291 days.

(21) Appl. No.: 12/643,608

(22) Filed: Dec. 21, 2009

(65) Prior Publication Data

US 2010/0156447 A1 Jun. 24, 2010

(30) Foreign Application Priority Data

Dec. 23, 2008 (EP) .................................. 08172843

(51) Int. Cl.
*G01R 27/02* (2006.01)
(52) U.S. Cl. ................ 324/605; 324/601; 324/676
(58) Field of Classification Search .................. 324/605, 324/601, 676, 616, 202, 750.02, 754.01–754.31, 324/617, 532, 533
See application file for complete search history.

(56) References Cited

U.S. PATENT DOCUMENTS

| | | | | |
|---|---|---|---|---|
| 7,545,152 B2 * | 6/2009 | Grund | ........................... | 324/605 |
| 7,821,272 B2 * | 10/2010 | Scholz et al. | .................. | 324/601 |
| 7,893,696 B2 * | 2/2011 | Stockinger | .................... | 324/534 |

FOREIGN PATENT DOCUMENTS

EP 1 972 952 9/2008

OTHER PUBLICATIONS

Tremouilles et al., "Transient voltage overshoot in TLP testing—Real or artifact?" Microelectronics and Reliability, Elsevier Science Ltd., GB 47(7):1016-1024 (2007).
European Search Report for EP 08 17 2843 dated Jun. 11, 2009.

\* cited by examiner

*Primary Examiner* — Patrick Assouad
*Assistant Examiner* — Alesa Allgood
(74) *Attorney, Agent, or Firm* — McDonnell Boehnen Hulbert & Berghoff LLP

(57) ABSTRACT

Calibration method for calibrating transient behavior of a TLP test system. The system comprises a TLP generator, probe needles, nominally impedance matched transmission lines and measurement equipment, connected between the transmission lines and the TLP generator, for detecting transient behavior of a device under test by simultaneously capturing voltage and current waveforms as a result of generated pulses. The calibration method comprises (a) applying the TLP test system on an open and capturing first voltage and current waveforms; (b) applying the TLP test system on a calibration element having a known finite impedance and a known transient response and capturing second voltage and current waveforms; (c) transforming the captured first and second current and voltage waveforms to the frequency domain, and (d) determining calibration data for the transient behavior of the TLP test system on the basis of the transformed first and second voltage and current waveforms.

8 Claims, 2 Drawing Sheets

METHOD FOR CALIBRATING A TRANSMISSION LINE PULSE TEST SYSTEM

CROSS-REFERENCE TO RELATED APPLICATION

The present application claims priority to European Patent Application EP08172843.8 filed in the European Patent Office on Dec. 23, 2008, the entire contents of which is incorporated herein by reference.

BACKGROUND

1. Technical Field

The present invention relates to a method for calibrating a transmission line pulse (TLP) test system.

2. Background Art

Different on-wafer ESD test equipments are available today: TLP, vfTLP, HBM, and MM ESD tests. During such ESD stress tests, one wants to characterize the voltage and current waveforms through the device under test (DUT), during such an ESD stress. The known available measurement techniques do not result in V and I waveforms measured at the DUT level, however, as they will always include system parasitics like probe resistances and inductances, lossy transmission line interconnects etc.

Consequently, TLP type of measurements are only used for quasi static characterization of ESD clamps. There is a growing interest to study also the I and V transients during a TLP stress, because of the availability of an on-wafer TLP tester in any ESD test lab. Up to now, the only methodology with which this can be attained is disclosed in Trémouilles, D. et al., "Transient Voltage Overshoot in TLP testing—Real or Artifact?", EOSESD symposium 2005. This methodology needed RF characterization of the connection line and the probe parasitics, which is user unfriendly as it requires additional costly RF test equipment.

DISCLOSURE OF THE INVENTION

It is an aim of this invention to provide a calibration method for a TLP test system, with which the need for RF test equipment for characterization of the transient behaviour of the TLP test system can be avoided.

According to the invention, the aforementioned aim is achieved with the calibration method comprising the steps of claim 1.

The calibration method of the invention is for calibrating transient behaviour of a transmission line pulse test system, generally comprising:

a transmission line pulse generator for generating predetermined pulses for analyzing a device under test;

probe needles for applying said predetermined pulses on the device under test;

transmission lines connecting said probe needles to said transmission line pulse generator, said transmission lines being nominally impedance matched with said transmission line pulse generator; and measurement equipment for detecting transient behaviour of said device under test by simultaneously capturing voltage and current waveforms over said device under test as a result of said pulses, said measurement equipment being connected between said transmission lines and said transmission line pulse generator.

The calibration method of the invention comprises the steps of:

a) applying the transmission line pulse test system on an open and capturing first voltage and current waveforms by means of said measurement equipment, b) applying the transmission line pulse test system on a calibration element having a known finite impedance and a known transient response and capturing second voltage and current waveforms by means of said measurement equipment, c) transforming the captured first and second current and voltage waveforms to the frequency domain, d) determining calibration data for the transient behaviour of said transmission line pulse test system on the basis of said transformed first and second voltage and current waveforms.

According to the invention, a methodology is described to calibrate the voltage and current waveforms of a TLP test system by means of the proprietary measurement equipment, so that the need for additional RF equipment is avoided. The calibration methodology is easily integratable in any existing TLP software without requiring the addition of hardware.

TLP test system calibration is done using the voltage and current waveforms gathered on an open and a known calibration element having a known finite impedance, preferably a short. From the captured waveforms, a model can be extracted for the needle parasitics and the lossy transmission line interconnects. Surprisingly, this method is independent of the pulse shape generated by the tester (meaning that the square pulse can feature long rise and fall time, and even have severe tester related artifacts).

As used herein, an "open" is intended to mean that the probe needles are not brought into contact with any element, i.e. the impedance between the probe needles is virtually infinite.

As used herein, a "short" is intended to mean that the probe needles are brought into contact with each other, i.e. the test system is shorted.

Preferred embodiments of the invention are described in the dependent claims.

BRIEF DESCRIPTION OF THE DRAWINGS

The invention will be further elucidated by means of the following description and the appended drawings.

MODES FOR CARRYING OUT THE INVENTION

Figure 1:
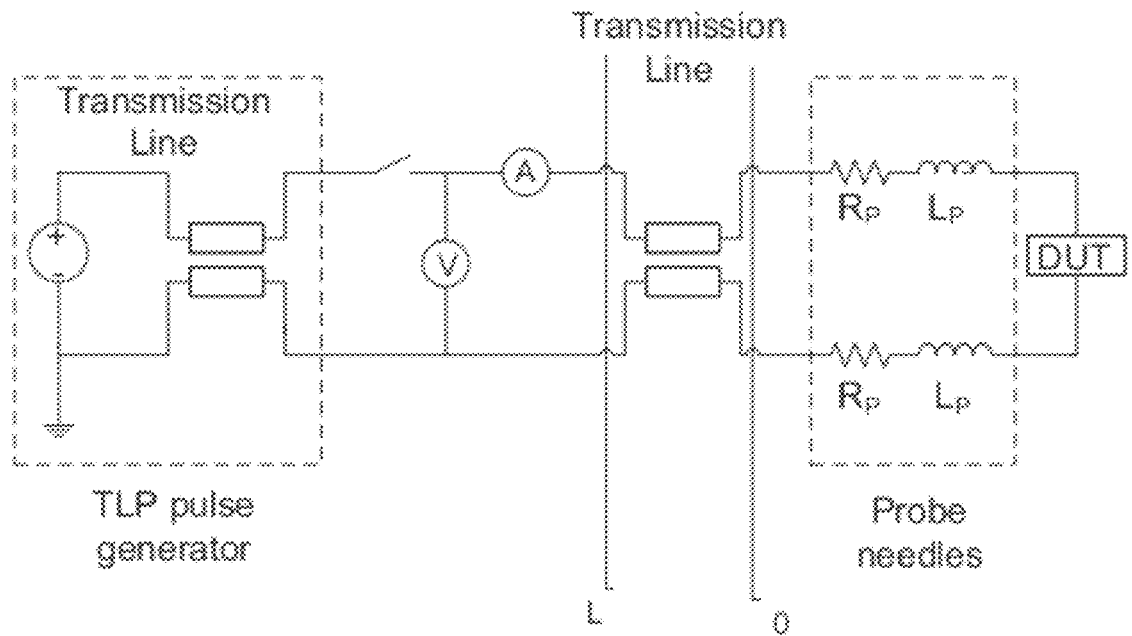
FIG. 1 provides a schematic configuration of a very fast TLP(vfTLP) measurement system including parasitic elements (probe parasitics, a lossy transmission line with length L) which can be calibrated according to the invention.

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. The dimensions and the relative dimensions do not necessarily correspond to actual reductions to practice of the invention.

Furthermore, the terms first, second, third and the like in the description and in the claims, are used for distinguishing between similar elements and not necessarily for describing a sequential or chronological order. The terms are interchangeable under appropriate circumstances and the embodiments of the invention can operate in other sequences than described or illustrated herein.

Moreover, the terms top, bottom, over, under and the like in the description and the claims are used for descriptive purposes and not necessarily for describing relative positions. The terms so used are interchangeable under appropriate circumstances and the embodiments of the invention described herein can operate in other orientations than described or illustrated herein.

The term "comprising", used in the claims, should not be interpreted as being restricted to the means listed thereafter; it does not exclude other elements or steps. It needs to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

Below a methodology is described to calibrate the voltage and current waveforms of a TLP tester, which can avoid the need of additional RF equipment and can be easily integrated in any existing TLP software.

FIG. 1 provides a schematic configuration of a very fast TLP(vfTLP) measurement system. The TLP pulse generator, comprising the generator and an internal transmission line connecting the generator to the current/voltage measurements tools A,V, is connected via a transmission line having a length L and probe needles to the device under test (DUT). In real life, the probe needles will have parasitic impedances modelled as a parasitic resistance Rp and a characteristic inductance Lp. In real life, the transmission line will result in signal loss. Both parasitic effects, probe needles and lossy transmission line, need to be removed from the DUT voltage and current response. The present application discloses a method for calibrating the vfTLP measurement set-up such that the obtained voltage and current response can be corrected for these parasitic effects.

The TLP calibration is done using the voltage and current waveforms gathered on an open and a short as preferably the only two calibration elements. From this data, the methodology is able to extract a model for the needle parasitics and the lossy transmission line interconnects, see FIG. 1. This method is independent of the pulse shape generated by the tester (meaning that the square pulse can feature long rise and fall time, and even have severe tester related artifacts).

Figure 2:
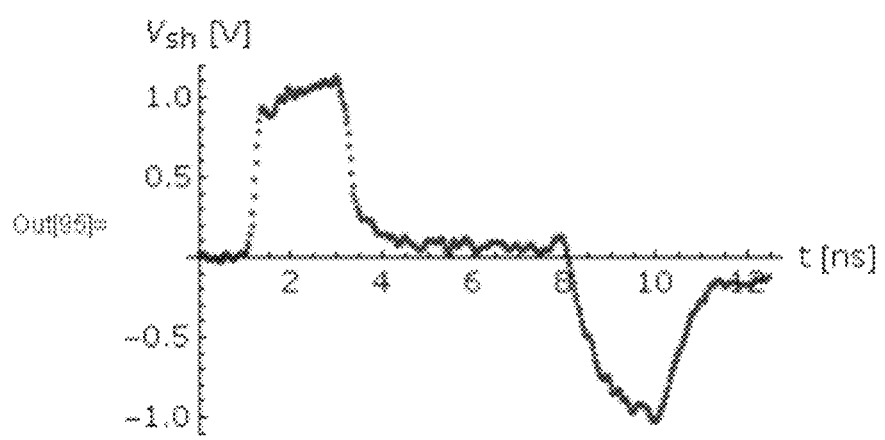
FIG. 2 shows an example vfTLP voltage waveform of voltage measurement data on a short as DUT. Left side is the incoming pulse, at the right side, the reflected pulse.

Of course, the signal coming from the pulse generator is in practice not a perfect rectangular pulse. Such a real pulse is shown in FIG. 2, left hand. The parasitics of the pulse generator, e.g. internal transmission line, influence the final shape of the pulse offered by the pulse generator. However by measuring the pulses at the beginning of the lossy transmission line/probe needles (see position current A and voltage V measurement tool in FIG. 1) and using the ratio of the here measured incoming/reflected signals, one can eliminate the parasitics of the TLP generator.

The TLP calibration can also be done in case the TLP test system comprises multiple pairs of probe needles with associated transmission lines. The method is repeated for each pair of probe needles.

For the calibration, the voltage and current waveforms collected on an open and a short are transformed to the Laplace domain: $L\{v_{OP}(x,t)\} L\{i_{OP}(x,t)\}$, $L\{v_{SH}(x,t)\} L\{i_{SH}(x,t)\}$ with x the position along the lossy transmission line. It has been found that the Laplace domain is best suited to handle transient signals. In the Laplace domain, the transmission line equations can be written in the following matrix form (note that x=0 corresponds with the load position on the transmission line):

$$\begin{pmatrix} \mathscr{L}[v[x,t]] \\ \mathscr{L}[i[x,t]] \end{pmatrix} = \begin{pmatrix} \cosh[x\gamma[s]] & Z_0[s]\sinh[x\gamma[s]] \\ \dfrac{\sinh[x\gamma[s]]}{Z_0[s]} & \cosh[x\gamma[s]] \end{pmatrix} \cdot \begin{pmatrix} \mathscr{L}[v[0,t]] \\ \mathscr{L}[i[0,t]] \end{pmatrix}$$

with $$\begin{pmatrix} Z_0[s] \\ \gamma_u[s] \end{pmatrix} = \begin{pmatrix} \sqrt{\dfrac{r+ls}{g+cs}} \\ \sqrt{(g+cs)(r+ls)} \end{pmatrix}$$

For small, or even negligible, losses over the line, these parameters become:

$$\begin{pmatrix} Z_0[s] \\ \gamma_u[s] \end{pmatrix} \approx \begin{pmatrix} \sqrt{\dfrac{1}{c}}\left(1 + \dfrac{1}{2}s\left(\dfrac{r}{1}-\dfrac{g}{c}\right)\right) \\ \sqrt{1c}\left(s + \dfrac{1}{2}\left(\dfrac{r}{1}+\dfrac{g}{c}\right)\right) \end{pmatrix} \approx \begin{pmatrix} \sqrt{\dfrac{1}{c}} \\ \sqrt{1c}\,s \end{pmatrix}$$

Assuming a frequency independent characteristic impedance $Z_0=50$ (heaviside condition), a frequency independent attenuation $\alpha$ and delay $\Delta t$ (no dispersion) for the transmission line with length L, the transmission line parameters $z_0[s]$ & $\gamma_u[s]$ become:

$$\begin{pmatrix} Z_0[s] \\ \gamma_u[s] \end{pmatrix} = \begin{pmatrix} \sqrt{\dfrac{1}{c}}\left(1 + \dfrac{1}{2}s\left(\dfrac{r}{1}-\dfrac{g}{c}\right)\right) \\ \sqrt{1c}\left(s + \dfrac{1}{2}\left(\dfrac{r}{1}+\dfrac{g}{c}\right)\right) \end{pmatrix} \approx \begin{pmatrix} Z_0 \\ \dfrac{\Delta ts + \alpha_L}{L} \end{pmatrix} \quad (1)$$

When accounting for an extra timing difference between the voltage and current signals measured at the transmission line input, the signal transfer matrix equation for the short measurement becomes:

$$\begin{pmatrix} \mathscr{L}[v_{sh}[L,t]] \\ \mathscr{L}[i_{sh}[L,t-\Delta t_{sh}]] \end{pmatrix} = \quad (2)$$

$$\begin{pmatrix} \cosh[\gamma[s]] & Z_0\sinh[\gamma[s]] \\ \dfrac{\sinh[\gamma[s]]}{Z_0} & \cosh[\gamma[s]] \end{pmatrix} \cdot \begin{pmatrix} \mathscr{L}[v_{sh}[0,t]] \\ \mathscr{L}[i_{sh}[0,t]] \end{pmatrix}$$

with $\gamma[s]=\gamma_u[s]L$

Note that the DUT position is taken as the spatial reference x=0 in present formalism. The advantage of the transmission matrix is that its inverse simplifies into:

$$\text{Simplify}\left[\text{Inverse}\left[\left\{\{\text{Cosh}[\gamma[s]], Z0\text{Sinh}[\gamma[s]]\}, \left\{\frac{\text{Sinh}[\gamma[s]]}{Z0}, \text{Cosh}[\gamma[s]]\right\}\right\}\right]\right]$$

which allows for straightforward inversion of the equation:

$$\begin{pmatrix} \mathscr{S}[v_{sh}[0,t]] \\ \mathscr{S}[i_{sh}[0,t]] \end{pmatrix} = \qquad(3)$$

$$\begin{pmatrix} \text{Cosh}[\gamma[s]] & -Z_0\text{Sinh}[\gamma[s]] \\ -\dfrac{\text{Sinh}[\gamma[s]]}{Z_0} & \text{Cosh}[\gamma[s]] \end{pmatrix} \cdot \begin{pmatrix} \mathscr{S}[v_{sh}[L,t]] \\ \mathscr{S}[i_{sh}[L,t]]e^{-\Delta t_{sh}s} \end{pmatrix}$$

$$\Rightarrow \frac{\mathscr{S}[v_{sh}[0,t]]}{\mathscr{S}[i_{sh}[0,t]]} = \frac{\dfrac{\mathscr{S}[v_{sh}[L,t]]}{\mathscr{S}[i_{sh}[L,t]]}e^{\Delta t_{sh}s} - Z_0\text{Tanh}[\gamma[s]]}{1 - \dfrac{\mathscr{S}[v_{sh}[L,t]]}{z_0\mathscr{S}[i_{sh}[L,t]]}\text{Tanh}[\gamma[s]]e^{\Delta t_{sh}s}} \qquad(4)$$

The signal transfer matrix equation for the open measurement becomes:

$$\begin{pmatrix} \mathscr{S}[v_{op}[L,t]] \\ \mathscr{S}[i_{op}[L,t-\Delta t_{op}]] \end{pmatrix} = \qquad(5)$$

$$\begin{pmatrix} \text{Cosh}[\gamma[s]] & Z_0\text{Sinh}[\gamma[s]] \\ \dfrac{\text{Sinh}[\gamma[s]]}{Z_0} & \text{Cosh}[\gamma[s]] \end{pmatrix} \cdot \begin{pmatrix} \mathscr{S}[v_{op}[0,t]] \\ 0 \end{pmatrix}$$

It allows for elimination of the open voltage waveform $v_{op}[0,t]$ at the DUT side:

$$\Rightarrow \text{Tanh}[\gamma[s]] = \frac{Z_0 \mathscr{S}[i_{op}[L,t]]e^{-\Delta t_{op}s}}{\mathscr{S}[v_{op}[L,t]]} \qquad(6)$$

The above equation can also be used separately for characterization of the transmission line. Furthermore, substitution into equation (4) allows for elimination of the transmission line parameters, even in the presence of non-negligible attenuation and dispersion, while only assuming a real valued $Z_0$, so that the transfer function in the Laplace domain describing the parasitic impedance can be expressed in terms of the four calibration waveforms only:

$$\frac{\mathscr{S}[v_{sh}[0,t]]}{\mathscr{S}[i_{sh}[0,t]]} = \frac{\dfrac{\mathscr{S}[v_{sh}[L,t]]}{\mathscr{S}[i_{sh}[L,t]]}e^{\Delta t_{sh}s} - Z_0^2\dfrac{\mathscr{S}[i_{op}[L,t]]}{\mathscr{S}[v_{op}[L,t]]}e^{-\Delta t_{op}s}}{1 - \dfrac{\mathscr{S}[v_{sh}[L,t]]\mathscr{S}[i_{op}[L,t]]}{\mathscr{S}[i_{sh}[L,t]]\mathscr{S}[v_{op}[L,t]]}e^{(\Delta t_{sh}-\Delta t_{op})s}} \qquad(7)$$

or alternatively:

$$\frac{\mathscr{S}[v_{sh}[0,t]]}{\mathscr{S}[i_{sh}[0,t]]} = \frac{\dfrac{\mathscr{S}[v_{sh}[L,t]]\mathscr{S}[v_{op}[L,t]]}{\mathscr{S}[i_{sh}[L,t]]\mathscr{S}[i_{op}[L,t]]}e^{(\Delta t_{sh}+\Delta t_{op})s} - Z_0^2}{\dfrac{\mathscr{S}[v_{op}[L,t]]}{\mathscr{S}[i_{op}[L,t]]}e^{\Delta t_{op}s} - \dfrac{\mathscr{S}[v_{sh}[L,t]]}{\mathscr{S}[i_{sh}[L,t]]}e^{\Delta t_{sh}s}} \qquad(7)$$

When modeling the parasitics with a lumped series resistance Rs and a lumped series inductance $L_s$, equation (7) can be fitted onto a straight line as a function of a chosen (real valued) s range, limited by the resolution of the waveform samples. Once the parasitics have been extracted, the relation between the voltage and current at the probe and those at the DUT is defined by the matrix equation:

$$\begin{pmatrix} \mathscr{S}[v_{TL}[0,t]] \\ \mathscr{S}[i_{TL}[0,t]] \end{pmatrix} = \begin{pmatrix} 1 & R_s + L_s s \\ 0 & 1 \end{pmatrix} \cdot \begin{pmatrix} \mathscr{S}[v_{DUT}[0,t]] \\ \mathscr{S}[i_{DUT}[0,t]] \end{pmatrix} \qquad(8)$$

Combining this with the signal transfer matrix for the transmission line leads to:

$$\begin{pmatrix} \mathscr{S}[v_{DUT}[0,t]] \\ \mathscr{S}[i_{DUT}[0,t]] \end{pmatrix} = \begin{pmatrix} 1 & -R_s - L_s s \\ 0 & 1 \end{pmatrix} \cdot \qquad(9)$$

$$\begin{pmatrix} \text{Cosh}[\gamma[s]] & -Z_0\text{Sinh}[\gamma[s]] \\ -\dfrac{\text{Sinh}[\gamma[s]]}{Z_0} & \text{Cosh}[\gamma[s]] \end{pmatrix} \cdot \begin{pmatrix} \mathscr{S}[v_{TL}[L,t]] \\ \mathscr{S}[i_{TL}[L,t]]e^{-\Delta t_{meas}s} \end{pmatrix}$$

Figure 3:
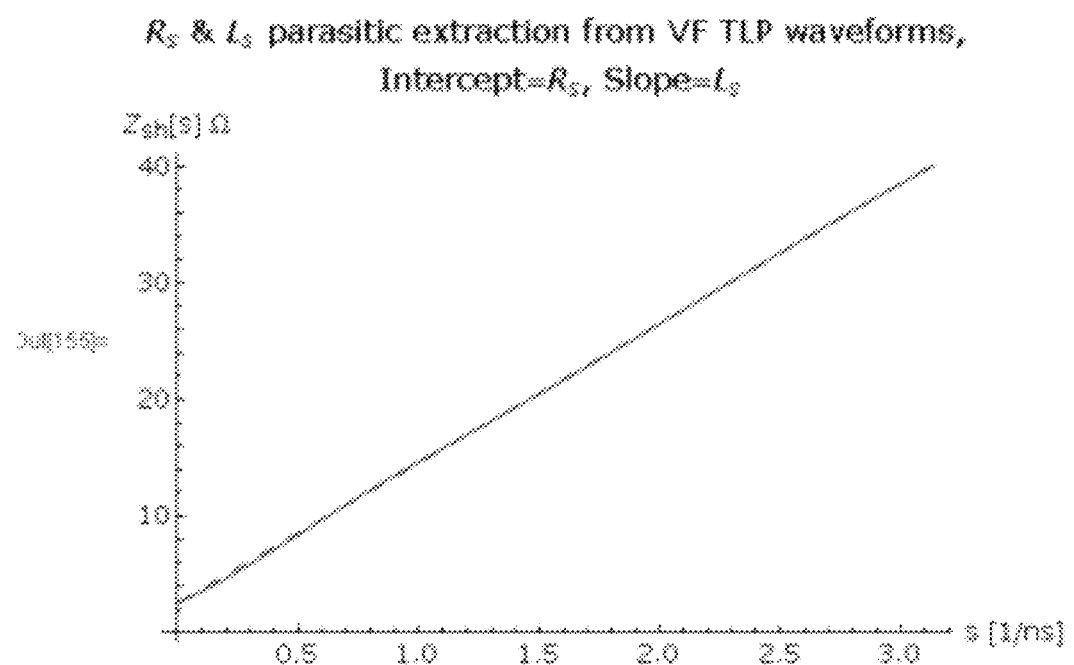
FIG. 3 shows the extracted Rs (or Rp as in FIG. 1) and Ls (or Lp as in FIG. 1) out of the voltage and current measurements of a vfTLP pulse on a open and a short.

FIGS. 2 and 3 show a demo extraction with measurement data. FIG. 2 shows an example waveform of a raw voltage measurement data on a short as DUT. On the left side of FIG. 2 the positive pulse generated by the TLP pulse generator can be seen. This signal is obtained by the voltage measurement tool V just before the lossy transmission line. This positive pulse will be transmitted via the lossy transmission line and the probe needles to the DUT. When the incoming voltage waveform is reflected by the DUT, the reflected voltage waveform will be transmitted back via the probe needles and the lossy transmission line to the voltage measurement tool V. This reflected signal is shown as a negative pulse in FIG. 2 appearing some time after the TLP pulse is generated. Both voltage signals, incoming and reflected, are influenced by the parasitics of the lossy transmission line and the probe needles. Similar waveforms can be obtained for current measurement.

FIG. 3 shows the extracted Rs (or Rp as in FIG. 1) and Ls (or Lp as in FIG. 1) out of the voltage and current measurements of a vfTLP pulse on a open and a short. When generating voltage and current vfTLP waveforms, similar to the one shown in FIG. 2, for DUT's with different impedance, e.g. an open and a short, one can extract the parasitics from these generated waveforms.

According to an embodiment, if the obtained voltage and current vfTLP waveforms are handled, one can extract the lumped parasitic series resistance Rs, lumped parasitic series inductance Ls, the time delay DELTA(tsh) between the voltage and the current waveforms in case of a short and the time delay DELTA(top) between the voltage and current waveforms in case of an open. In this calibration it is assumed that the transmission line has a frequency independent characteristic impedance Zo=50 ohm.

FIG. 3 plots the impedance Zsh, i.e. the ratio vfTLP voltage waveform to vfTLP current waveform measured in case of short, as a function of frequency. From the slope of this curve one can deduct the parasitic inductance Ls, while the real valued intercept of the curve with the y-axis corresponds to the parasitic impedance Rs.

What is claimed is:

1. A calibration method for calibrating transient behaviour of a transmission line pulse test system which includes a transmission line pulse generator for generating predetermined pulses for analyzing a device under test; probe needles for applying said predetermined pulses on the device under test; transmission lines connecting said probe needles to said transmission line pulse generator, said transmission lines being nominally impedance matched with said transmission line pulse generator; and measurement equipment for detecting transient behaviour of said device under test by simultaneously capturing voltage and current waveforms over said device under test as a result of said pulses, said measurement equipment being connected between said transmission lines and said transmission line pulse generator, the calibration method comprising the steps of:
- (a) applying the transmission line pulse test system on an open and capturing first voltage and current waveforms with said measurement equipment;
- (b) applying the transmission line pulse test system on a calibration element having a known finite impedance and a known transient response and capturing second voltage and current waveforms with said measurement equipment;
- (c) transforming the captured first and second current and voltage waveforms to the frequency domain; and
- (d) determining calibration data for the transient behaviour of said transmission line pulse test system on the basis of said transformed first and second voltage and current waveforms.

2. A method according to claim 1, wherein said calibration data is determined by a transfer function determined from both the first and second current waveforms.

3. A method according to claim 1, wherein said calibration data comprises a parasitic impedance of the probe needles and a characteristic impedance, transmission loss and attenuation of said transmission lines.

4. A method according to claim 1, wherein said calibration element of step (b) is a short.

5. A method according to claim 1, wherein said probe needles comprise multiple pairs of probe needles with associated transmission lines and each of the steps, (a), (b), (c) and (d), is performed for each pair of probe needles.

6. A method for analyzing the electrostatic discharge robustness of a device under test by means of a transmission line pulse test system, said test system including a transmission line pulse generator for generating predetermined pulses for analyzing the device under test; probe needles for applying said predetermined pulses on the device under test; transmission lines connecting said probe needles to said transmission line pulse generator, said transmission lines being nominally impedance matched with said transmission line pulse generator; and measurement equipment for detecting transient behaviour of said device under test by simultaneously capturing voltage and current waveforms over said device under test as a result of said pulses, said measurement equipment being connected between said transmission lines and said transmission line pulse generator, the method comprising the steps of:
- (a) applying said predetermined pulses by means of the transmission line pulse test system on said device under test;
- (b) simultaneously capturing, by means of the measurement equipment, voltage and current waveforms occurring over said device under test as a result of said pulses;
- (c) correcting the voltage and current waveforms captured in step (b) using calibration data obtained by applying the transmission line pulse test system on an open and capturing first voltage and current waveforms with said measurement equipment;
    applying the transmission line pulse test system on a calibration element having a known finite impedance and a known transient response and capturing second voltage and current waveforms with said measurement equipment;
    transforming the captured first and second current and voltage waveforms to the frequency domain; and
    determining calibration data for the transient behaviour of said transmission line pulse test system on the basis of said transformed first and second voltage and current waveforms.

7. A method according to claim 6, wherein said calibration data is determined by a transfer function determined from both the first and second current waveforms.

8. A method according to claim 7, further comprising:
    transforming the captured voltage and current waveforms to the frequency domain;
    applying the transfer function determined from both the first and second current waveforms to the transformed current and voltage waveforms, thereby obtaining corrected transformed current and voltage waveforms; and
    transforming the corrected transformed current and voltage waveforms to the time domain.

* * * * *